(12) United States Patent
Hayakawa et al.

(10) Patent No.: US 11,485,877 B2
(45) Date of Patent: Nov. 1, 2022

(54) STRUCTURE BODY, SENSOR, AND METHOD FOR PRODUCING STRUCTURE BODY

(71) Applicant: DENSO CORPORATION, Kariya (JP)

(72) Inventors: Kei Hayakawa, Kariya (JP); Hajime Shingai, Kariya (JP); Akira Nukazuka, Kariya (JP); Hitoshi Kuno, Kariya (JP)

(73) Assignee: DENSO CORPORATION, Kariya (JP)

( * ) Notice: Subject to any disclaimer, the term of this patent is extended or adjusted under 35 U.S.C. 154(b) by 121 days.

(21) Appl. No.: 17/037,168

(22) Filed: Sep. 29, 2020

(65) Prior Publication Data

US 2021/0017420 A1    Jan. 21, 2021

Related U.S. Application Data

(63) Continuation of application No. PCT/JP2019/010541, filed on Mar. 14, 2019.

(30) Foreign Application Priority Data

Apr. 3, 2018  (JP) .............................. JP2018-071510

(51) Int. Cl.
*B05D 1/18*    (2006.01)
*C09D 183/08*    (2006.01)
(Continued)

(52) U.S. Cl.
CPC ............. *C09D 183/08* (2013.01); *B05D 1/18* (2013.01); *B05D 3/062* (2013.01); *B05D 3/104* (2013.01);
(Continued)

(58) Field of Classification Search
None
See application file for complete search history.

(56) References Cited

U.S. PATENT DOCUMENTS 4,628,037 A    12/1986  Changon et al.
6,262,216 B1 *   7/2001  McGall .............. C08G 73/0206
                                                 422/50
(Continued)

FOREIGN PATENT DOCUMENTS

JP    H06-079167 A    3/1994
JP    2002-053805 A    2/2002
(Continued)

OTHER PUBLICATIONS

Japanese Journal of Applied Physics, Frictional Properties of Organosilane Self-Assembled Monolayer in Vacuum, Kazuyuki Hayashi et al 2001 Jpn. J. Appl. Phys. 40 4344.
(Continued)

*Primary Examiner* — Shamim Ahmed
*Assistant Examiner* — Bradford M Gates
(74) *Attorney, Agent, or Firm* — Posz Law Group, PLC

(57) ABSTRACT

A structure body includes a base material and a siloxane based molecular membrane formed on the base material by use of an organic compound represented by Formula (1) or Formula (2):

Formula (1)

$$\text{R8}-\underset{\underset{R9}{|}}{\overset{\overset{R7}{|}}{\text{Si}}}-\text{R6}-\underset{R5\ \ R4}{\overset{R3\ \ R2}{\bigcirc}}-\text{R1}$$

(Continued)

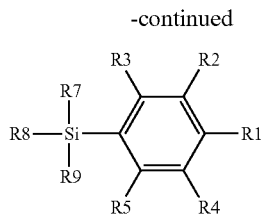

Formula (2)

wherein any one of R1 to R5 is an amino group, others of R1 to R5 are each independently hydrogen or an alkyl group, R7 to R9 are each independently any one of hydroxy group, alkoxy group, alkyl group, and phenyl group on condition that one or more of R7 to R9 are each independently a hydroxy group or an alkoxy group, and R6 is an alkyl group.

7 Claims, 9 Drawing Sheets

(51) Int. Cl.
*B05D 3/06* (2006.01)
*B05D 3/10* (2006.01)
*C23C 16/34* (2006.01)
*C23C 16/56* (2006.01)
*H01L 21/02* (2006.01)

(52) U.S. Cl.
CPC ............ *B05D 3/107* (2013.01); *C23C 16/345* (2013.01); *C23C 16/56* (2013.01); *H01L 21/02227* (2013.01); *H01L 21/02304* (2013.01); *B05D 2203/35* (2013.01); *B05D 2518/10* (2013.01)

(56) References Cited

U.S. PATENT DOCUMENTS

| | | |
|---|---|---|
| 2003/0022182 A1 | 1/2003 | Barany et al. |
| 2003/0082588 A1 | 5/2003 | Garimella |
| 2004/0259094 A1 | 12/2004 | Odedra et al. |
| 2006/0281889 A1 | 12/2006 | Kobayashi et al. |
| 2008/0261827 A1* | 10/2008 | Iwakura ................. G01N 21/31 506/18 |

FOREIGN PATENT DOCUMENTS

| | | |
|---|---|---|
| JP | 2005-097527 A | 4/2005 |
| JP | 2006-255811 A | 9/2006 |
| JP | 2007-145984 A | 6/2007 |
| JP | 2013-111500 A | 6/2013 |
| JP | 2015-200570 A | 11/2015 |
| JP | 2017-145199 A | 8/2017 |

OTHER PUBLICATIONS

Biosensors and Bioelectronics, Label free CMOS DNA image sensor based on the charge transfer technique, Y. Maruyama, S. Teraoa, K. Sawada, Biosensors and Bioelectronics 24 (2009) 3108-3112.

* cited by examiner

STRUCTURE BODY, SENSOR, AND METHOD FOR PRODUCING STRUCTURE BODY

CROSS REFERENCE TO RELATED APPLICATIONS

The present application is a continuation application of International Patent Application No. PCT/JP2019/010541 filed on Mar. 14, 2019, which designated the U.S. and claims the benefit of priority from Japanese Patent Application No. 2018-071510 filed on Apr. 3, 2018. The entire disclosures of all of the above applications are incorporated herein by reference.

TECHNICAL FIELD

The present disclosure relates to a structure body, a sensor, and a method for producing a structure body.

BACKGROUND

There have been known techniques of forming a siloxane based molecular membrane on a surface of a base material made of silicon or glass.

SUMMARY

The present disclosure provides a structure body, a sensor including a structure body, and a method for producing a structure body. Each of the structure bodies includes a base material and a siloxane based molecular membrane formed on the base material by use of an organic compound.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
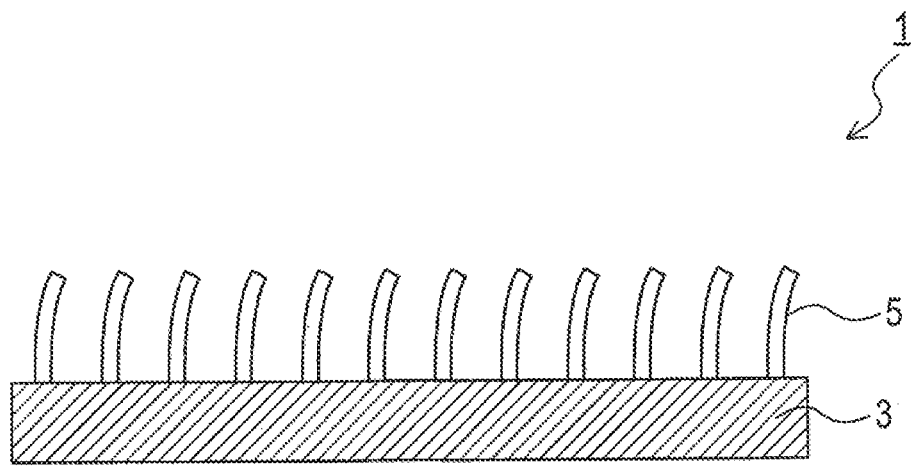
FIG. 1 is an explanatory view illustrating a configuration of a structure body.

There are techniques of forming a siloxane based molecular membrane onto a surface of a base material made of silicon or glass. The siloxane based molecular membrane can be formed by using a silane coupling reaction to cause an organic silane molecule to be chemically adsorbed onto a surface of a base material. The organic silane molecule is immobilized on the base material by siloxane network.

Examples of organic silane molecule include 3-aminopropyltriethoxysilane (hereinafter referred to as APTES). APTES has an amino group. APTES can be bonded to a biomolcule through the amino group. A siloxane based molecular membrane formed by use of APTES is usable for a multi-array biochip.

The inventors have made investigations in detail to find out the following issues: when APTES is used to form a siloxane based molecular membrane, APTES is easily agglomerated. When the agglomeration is generated in the siloxane based molecular membrane, the amount of APTES per unit area and the amount of the amino group per unit area are varied for each site in the resultant multi-array biochip. As a result, the multi-array biochip is unfavorably lowered in detection precision.

According to a first aspect of the present disclosure, a structure body includes a base material and a siloxane based molecular membrane formed on the base material by use of an organic compound represented by Formula (1) or Formula (2):

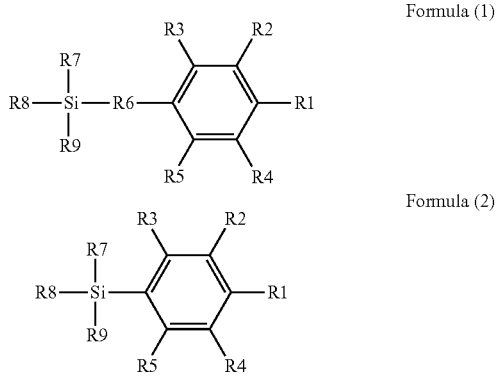

wherein any one of R1 to R5 is an amino group, others of R1 to R5 are each independently hydrogen or an alkyl group, R7 to R9 are each independently any one of hydroxy group, alkoxy group, alkyl group, and phenyl group on condition that one or more of R7 to R9 are each independently a hydroxy group or an alkoxy group, and R6 is an alkyl group.

The structure body according to the first aspect hardly cause agglomeration in the siloxane based molecular membrane.

According to a second aspect of the present disclosure, a method for producing a structure body that includes a base material and a siloxane based molecular membrane, includes: hydrophilizing a surface of the base material; bringing an organic compound into contact with the surface of the base material, the compound being represented by Formula (1) or Formula (2):

Formula (1)

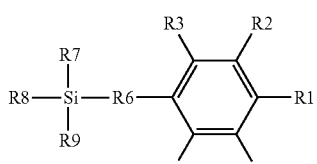

Formula (2)

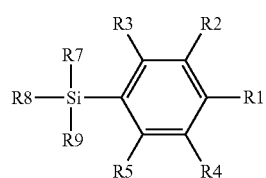

wherein any one of R1 to R5 is an amino group, others of R1 to R5 are each independently hydrogen or an alkyl group, R7 to R9 are each independently any one of hydroxy group, alkoxy group, alkyl group, and phenyl group on condition that one or more of R7 to R9 are each independently a hydroxy group or an alkoxy group, and R6 is an alkyl group; and causing a hydrolysis reaction and a dehydration condensation reaction of the organic compound at a temperature of 50° C. or lower to form the siloxane based molecular membrane on the surface of the base material.

The method according to the second aspect can produce the structure body that hardly causes agglomeration in the siloxane based molecular membrane.

With reference to the drawings, exemplary embodiments of the present disclosure will be described 1. Structure Body A structure body according to one of the embodiments of the present disclosure includes a base material and a siloxane based molecular membrane. A raw material of the base material is not particularly limited. The base material is, for example, a silicon wafer. In order to form the siloxane based molecular membrane thereon, it is preferred that OH groups are present on a surface of the base material. The base material has, for example, a SiN membrane on the surface. On a surface of the SiN membrane, OH groups are present. The SiN membrane can be formed by, for example, a method of low pressure chemical vapor deposition (LPCVD). The form of the base material may be a substrate or any form other than the substrate.

The siloxane based molecular membrane is a membrane formed on the surface of the base material by use of an organic compound represented by Formula (1) or Formula (2):

Formula (1)

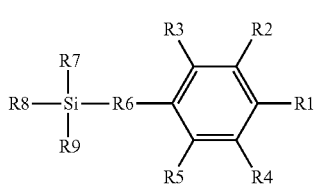

Formula (2)

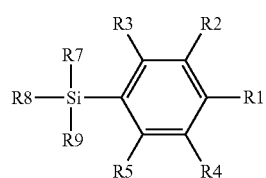

wherein any one of R1 to R5 is an amino group, others of R1 to R5 are each independently hydrogen or an alkyl group, R7 to R9 are each independently any one of hydroxy group, alkoxy group, alkyl group and phenyl group on condition that one or more of R7 to R9 are each independently a hydroxy group or an alkoxy group, and R6 is an alkyl group.

When any one of R1 to R5 is an alkyl group, the number of carbon atoms in the alkyl group is preferably in a range from 1 to 2. The number of carbon atoms in R6 is preferably in a range from 1 to 2.

The organic compound is, for example, an organic silane molecule. Examples of the organic compound include one or more selected from the group consisting of p-aminophenyltrimethoxysilane (hereinafter referred to as APTMS) represented by Formula (3), p-aminophenylsilanetriol represented by Formula (4), p-aminophenyltriethoxysilane represented by Formula (5), p-aminophenyltripropoxysilane represented by Formula (6), m-aminophenyltrimethoxysilane represented by Formula (7), o-aminophenyltrimethoxysilane represented by Formula (8), 4-[2-(triethoxysilyl)ethyl]-benzeneamine represented by Formula (9), 4-[(triethoxysilyl)methyl]-benzeneamine represented by Formula (10), 4-[dimethyl[2-(trimethoxysilyl)ethyl]silyl]-benzeneamine represented by Formula (11), bis(p-aminophenyl)-silanediol represented by Formula (12), bis(p-aminophenyl)-diethoxysilane represented by Formula (13), 4-(dimethoxysilyl)-benzeneamine represented by Formula (14), 4-(dimethoxymethylsilyl)-benzeneamine represented by Formula (15), 4-(diethoxymethylsilyl)-benzeneamine represented by Formula (16), 4-[(dimethoxysilyl)methyl]-benzeneamine represented by Formula (17), 1-(p-aminophenyl)-1,1-dimethyl-silanol represented by Formula (18), 4-(methoxysilyl)-benzeneamine represented by Formula (19), 4-(methoxydimethylsilyl)-benzeneamine represented by Formula (20), 4-(ethoxydimethylsilyl)-benzeneamine represented by Formula (21), p-(dimethylpropoxysilyl)-benzeneamine represented by Formula (22), 4-[(2-propoxy)silyl]-benzeneamine represented by Formula (23), and 4-(methoxymethylphenylsilyl)-benzeneamine represented by Formula (24).

Formula (3)

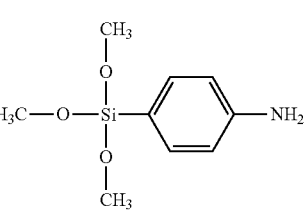

Formula (4)

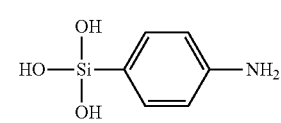

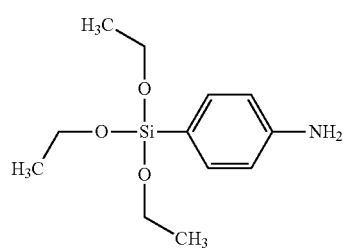
Formula (5)
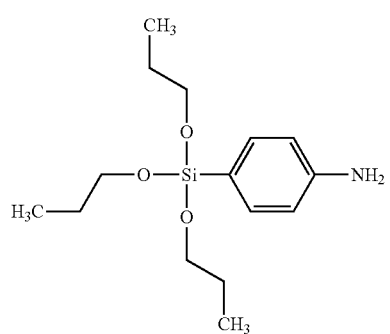
Formula (6)
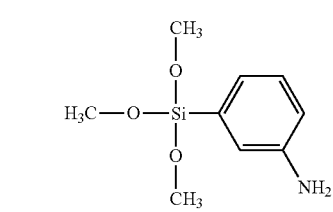
Formula (7)
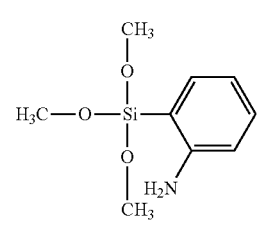
Formula (8)
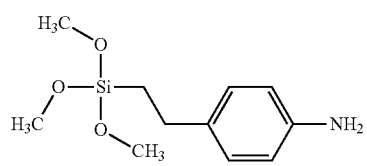
Formula (9)
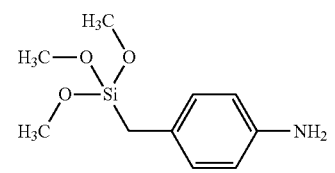
Formula (10)
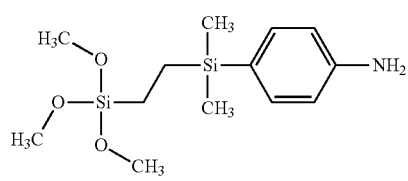
Formula (11)
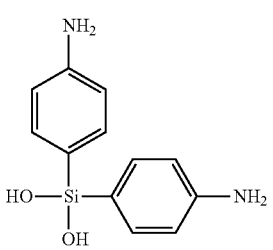
Formula (12)
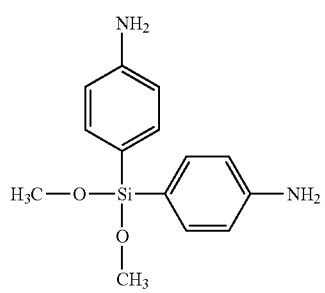
Formula (13)
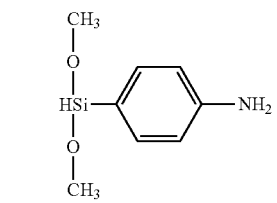
Formula (14)
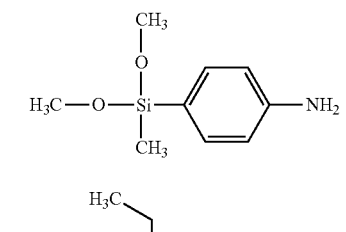
Formula (15)
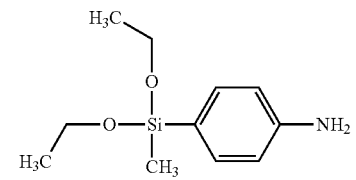
Formula (16)
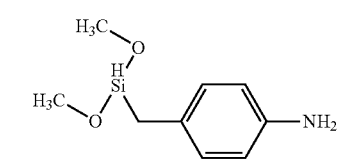
Formula (17)
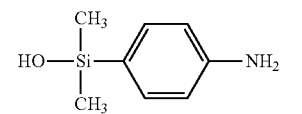
Formula (18)
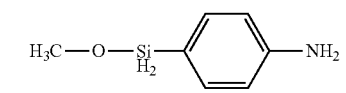
Formula (19)
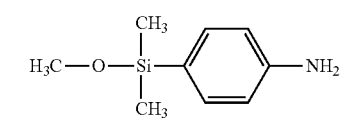
Formula (20)

Formula (21)

Formula (22)

Formula (23)

Formula (24)

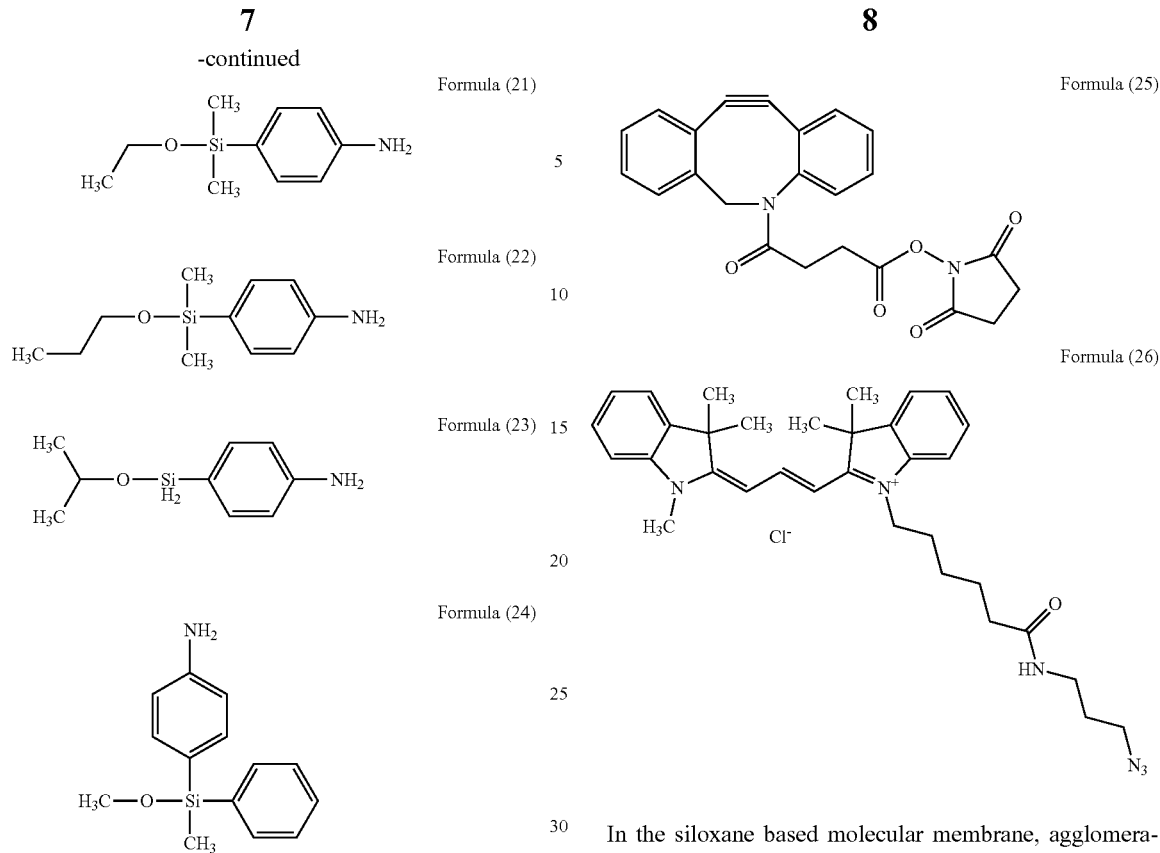

Formula (25)

Formula (26)

According to the structure body of the present embodiment, agglomeration hardly occurs in the siloxane based molecular membrane. The structure body of the present embodiment may further have a functional molecule (i.e., a functional molecule species) bonded to the siloxane based molecular membrane. The functional molecule is directly or indirectly bonded to, for example, an amino group included in the organic compound. The functional molecule has, for example, a function of being chemically or physically bonded to a specified molecule, a function of expressing water-repellency, or a catalytic function. The functional molecule is one or more selected from the group consisting of low small molecules, complexes, DNAs, peptides, antibodies, and sugar chains.

The structure body of the present embodiment has, for example, a form illustrated in FIG. 1. A structure body 1 has a base material 3, and a siloxane based molecular membrane 5. The siloxane based molecular membrane 5 is formed on a surface of the base material 3.

Figure 2:
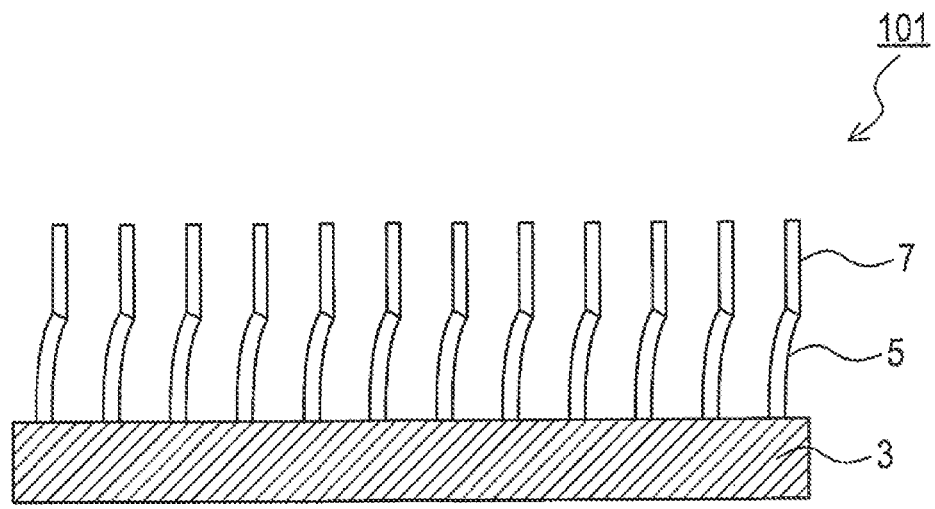
FIG. 2 is an explanatory view illustrating a configuration of a structure body further having a functional molecule.

The structure body of the present embodiment has a form illustrated in FIG. 2. A structure body 101 has a base material 3, a siloxane based molecular membrane 5 and a functional molecule 7. The siloxane based molecular membrane 5 is formed on a surface of the base material 3. The functional molecule 7 is bonded to the siloxane based molecular membrane 5.

The functional molecule is one or more selected from the group consisting of small molecules, complexes, DNAs, peptides, antibodies, and sugar chains. Examples of the functional molecule include DBCO-NHS, which is represented by Formula (25), and cyanine 3 azide, which is represented by Formula (26):

In the siloxane based molecular membrane, agglomeration hardly occurs. Accordingly, it possible to restrict the amount of the functional molecule per unit from being varied for each site of the siloxane based molecular membrane.

2. Sensor

A sensor of one of the embodiments of the present disclosure has a structure body. The sensor of the present embodiment may have an additional constituent or may not have any additional constituent besides the structure body. The structure body included in the sensor is the structure body further having the functional molecule among the structure bodies described above. The functional molecule is, for example, a molecule having a function of being chemically or physically bonded to a specified molecule. The sensor of the present embodiment can detect the specified molecule or determine the specified molecule quantitatively, for example, by bonding the specified molecule to the functional molecule.

In the sensor of the present embodiment, a plurality of functional molecule species are bonded to the siloxane based molecular membrane, and the functional molecule species bonded to different regions of the siloxane based molecular membrane are different from each other. When the functional molecule species bonded to the different regions of the siloxane based molecular membrane are different from each other, for example, the functional molecule species bonded to the different regions of the siloxane based molecular membrane can be bonded to molecule species different from each other. Accordingly, the sensor of the present embodiment can detect the plurality of molecule species or determine the quantities of the molecule species.

Figure 3:
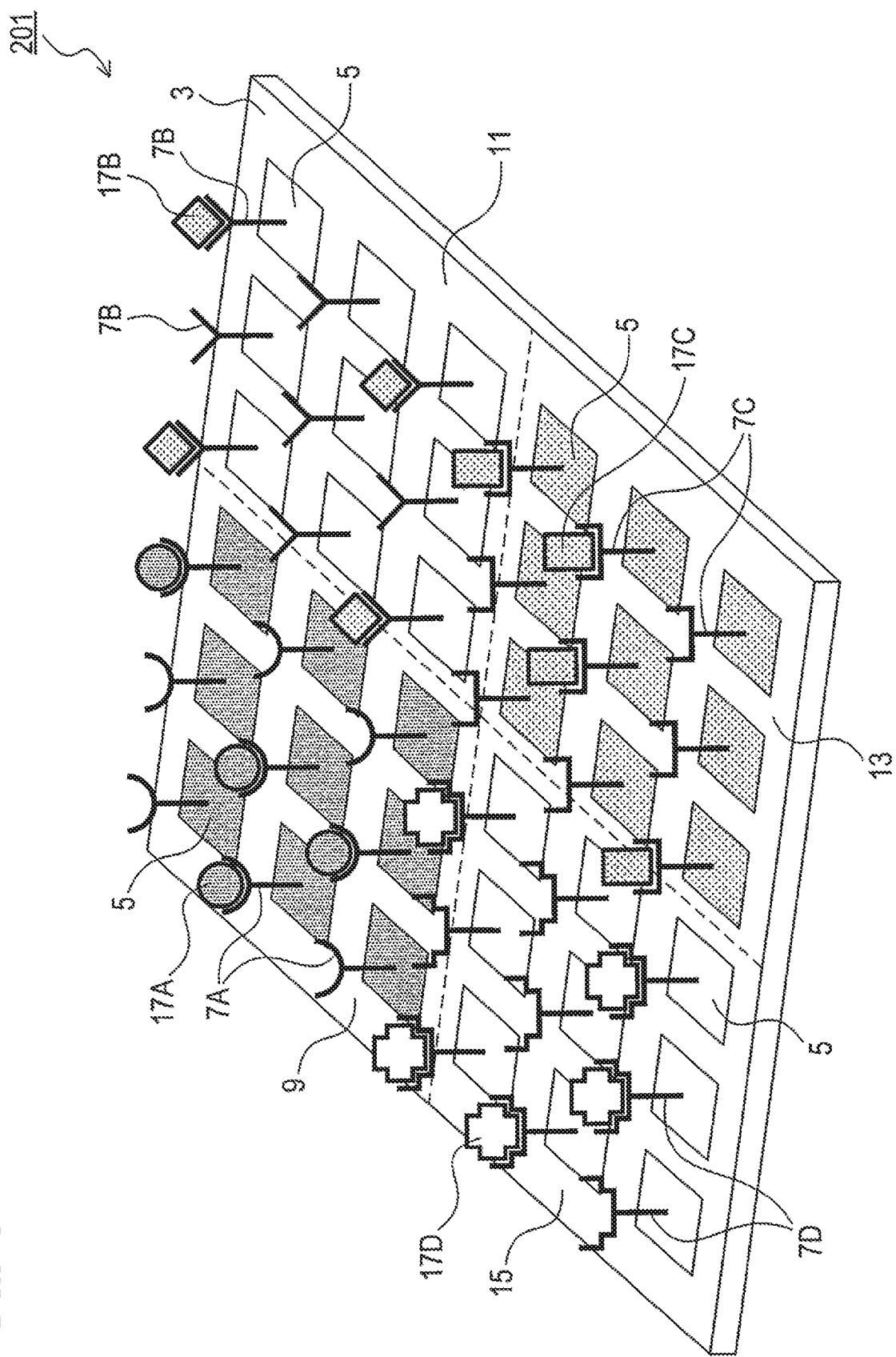
FIG. 3 is an explanatory view illustrating a configuration of a sensor.

According to the sensor of the present embodiment, agglomeration hardly occurs in the siloxane based molecular membrane. Therefore, the sensor of the present embodiment is high in detection precision. The sensor of the present embodiment has, for example, a configuration illustrated in FIG. 3. A sensor 201 is a multi-array type sensor device. The sensor 201 has a base material 3. A surface of the base material 3 is divided into four regions 9, 11, 13 and 15. In each of the regions, a siloxane based molecular membrane 5 is formed. In each of the regions, a plurality of pieces of the siloxane based molecular membrane 5 are present.

In the region 9, a plurality of molecules 7A of a functional molecule species are bonded to the siloxane based molecular membrane 5. The functional molecules 7A have a function of being chemically or physically bonded to specified molecules 17A. In the region 11, a plurality of molecules 7B of a functional molecule species are bonded to the siloxane based molecular membrane 5. The functional molecules 7B have a function of being chemically or physically bonded to specified molecules 17B. In the region 13, a plurality of molecules 7C of a functional molecule species are bonded to the siloxane based molecular membrane 5. The functional molecules 7C have a function of being chemically or physically bonded to specified molecules 17C. In the region 15, a plurality of molecules 7D of a functional molecule species are bonded to the siloxane based molecular membrane 5. The functional molecules 7D have a function of being chemically or physically bonded to specified molecules 17D.

The sensor 201 can detect each of the species of the specified molecules 17A, 17B, 17C and 17D. Moreover, the sensor 201 can determine the quantity of, for example, each of the species of the specified molecules 17A, 17B, 17C and 17D.

In the siloxane based molecular membrane 5, agglomeration hardly occurs. Accordingly, it possible to restrict the amount of each of the functional molecule species 7A, 7B, 7C and 7D per unit area from being varied for each site of the siloxane based molecular membrane. As a result, the sensor 201 is high in detection precision.

3. Structure Body Production Method

A structure body production method of one of the embodiments of the present disclosure is a method for producing a structure body having a base material and a siloxane based molecular membrane formed on a surface of the base material.

The structure body production method of the present embodiment includes hydrophilizing the surface of the base material. After the hydrophilizing treatment, the state of the surface of the base material is preferably a state that hydroxy groups are introduced on the surface. Examples of the way of the hydrophilizing include alkali treatment and UV treatment.

In the structure body production method of the present embodiment, after the hydrophilizing of the surface of the base material, an organic compound represented by Formula (1) or Formula (2) is brought into contact with the surface of the base material, and a hydrolysis reaction and a dehydration condensation reaction are caused at a temperature of 50° C. or lower to form a siloxane based molecular membrane on the surface of the base material.

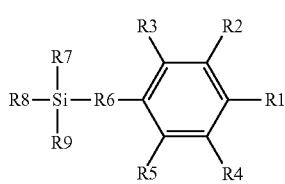

Formula (21)

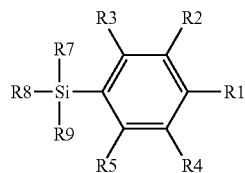

Formula (2)

wherein any one of R1 to R5 is an amino group, others of R1 to R5 are each independently hydrogen or an alkyl group, R7 to R9 are each independently any one of hydroxy group, alkoxy group, alkyl group, and phenyl group on condition that one or more of R7 to R9 are each independently a hydroxy group or an alkoxy group, and R6 is an alkyl group.

When any one of R1 to R5 is an alkyl group, the number of carbon atoms in the alkyl group is preferably in a range from 1 to 2. The number of carbon atoms in R6 is preferably in a range from 1 to 2.

According to the structure body production method of the present embodiment, agglomeration hardly occurs in the siloxane based molecular membrane. The organic compound is, for example, an organic silane compound. The organic compound is, for example, an organic compound represented by any one of Formulae (3) to (24).

When the hydrolysis reaction and the dehydration condensation reaction are caused, the temperature of the reaction system is preferably 40° C. or lower, more preferably 30° C. or lower. In a case where the temperature is 40° C. or lower when the hydrolysis reaction and the dehydration condensation reaction are caused, agglomeration more hardly occurs in the siloxane based molecular membrane.

The method for bringing the organic compound into contact with the surface of the base material is, for example, a method of bringing a saturated solution of the organic compound into the surface of the base material. The temperature of the saturated solution is 50° C. or lower. The temperature of the saturated solution is preferably 40° C. or lower, more preferably 30° C. or lower. When the temperature of the saturated solution is 40° C. or lower, agglomeration more hardly occurs in the siloxane based molecular membrane.

4. Example (4-1) Production of Structure Body of Example (i) Hydrophilization of Base Material A silicon wafer was prepared. This silicon wafer corresponds to a base material. On a surface of the silicon wafer, a SiN membrane had been formed by a low pressure chemical vapor deposition method. The SiN membrane has OH groups.

The silicon wafer was subjected to alkali treatment. The alkali treatment corresponds to hydrophilization. About the composition of a solution for the treatment, the solution was an aqueous solution of NaOH that had a concentration of 0.1 M. The temperature of the treatment solution was from 20 to 60° C. The period for the alkali treatment was one hour.

(ii) Preparation of Organic Silane Molecule Solution

Ten milligrams of APTMS were dissolved into 2 mL of THF to prepare an organic silane molecule solution. This organic silane molecule solution was a saturated solution.

(iii) Formation of Siloxane Based Molecular Membrane

The silicon wafer hydrophilized in the item (i) and the organic silane molecule solution prepared in the item (ii) were put into an airtightly-closable screw bottle. In the screw bottle, the silicon wafer was immersed in the organic silane molecule solution. The screw bottle was airtightly closed, and then allowed to stand still at room temperature for one hour. The airtight-closing of the screw bottle made it possible to restrain the solvent from being vaporized. At the time of allowing the bottle to stand still at room temperature for the one hour, a hydrolysis reaction and a dehydration condensation reaction of APTMS were generated to form a siloxane based molecular membrane on the surface of the silicon wafer.

(iv) Washing

The silicon wafer was taken out from the organic silane molecule solution, and then washed with THF. By this washing, APTMS was removed which had not been bonded to the surface of the silicon wafer.

Next, the silicon wafer was washed with a deionized water to remove THF. Next, the present system was subjected to nitrogen blowing to remove the deionized water. In this way, the silicon wafer was dried. Through the above-mentioned steps, a structure body (hereinafter referred to as the structure body of the example) was finished. The structure body of the example had the silicon wafer, and the siloxane based molecular membrane formed on the surface of this silicon wafer. The siloxane based molecular membrane was a membrane formed using APTMS.

(4-2) Production of Structure Body of Comparative Example

Basically in the same way as in the example, a structure body of a comparative example was produced. However, instead of APTMS, APTES was used as the organic silane molecule to form a siloxane based molecular membrane.

(4-3) Evaluations of Structure Bodies

Figure 4:
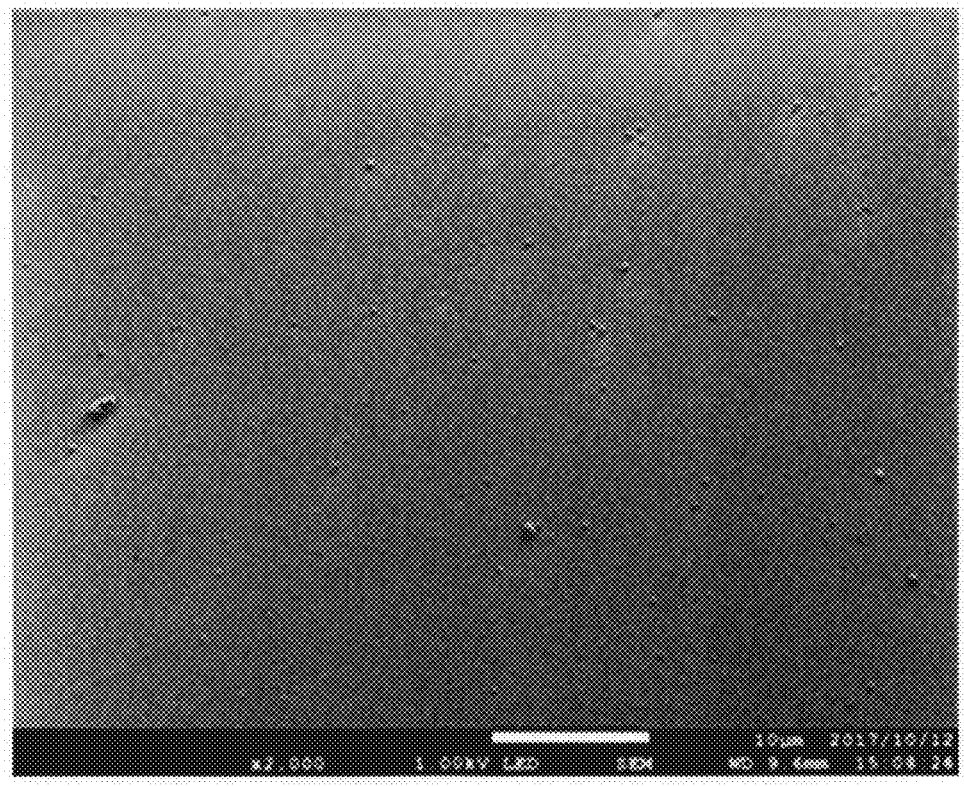
FIG. 4 is an SEM observed image of a structure body of an example.
Figure 5:
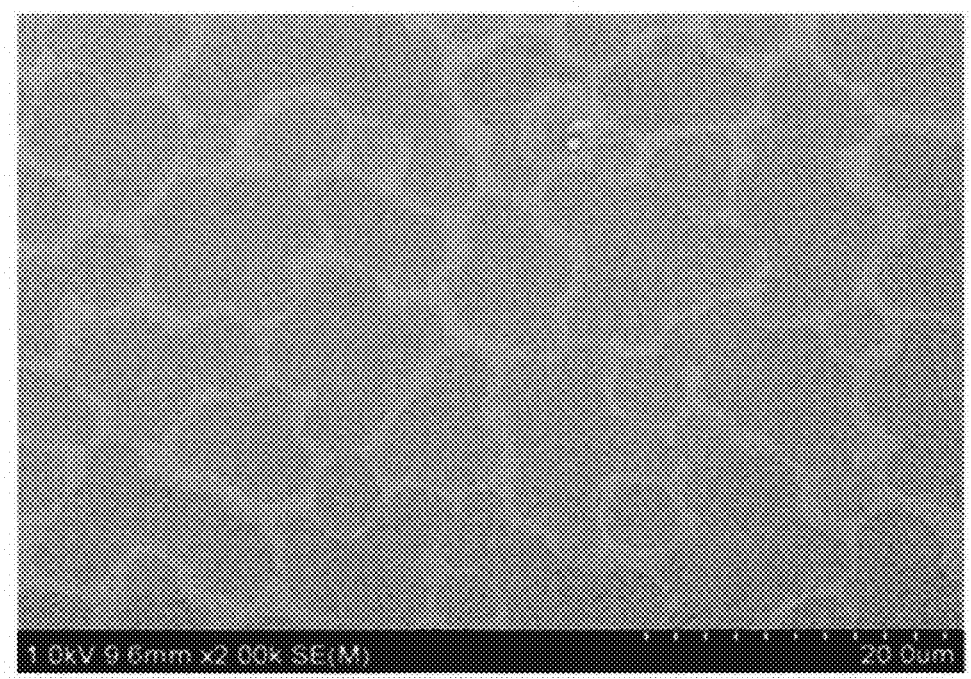
FIG. 5 is an SEM observed image of a structure body of a comparative example.

About each of the structure bodies of the example and the comparative example, an SEM was used to observe the siloxane based molecular membrane. An SEM observed image of the structure body of the example is shown in FIG. 4. An SEM observed image of the structure body of the comparative example is shown in FIG. 5.

About the structure body of the example, no island portion was observed in the siloxane based molecular membrane. About the structure body of the comparative example, a large number of island portions were observed in the siloxane based molecular membrane. The island portions were each an agglomerated portion of the siloxane based molecular membrane.

About each of the structure bodies of the example and the comparative example, XPS spectra of the siloxane based molecular membrane were gained. XPS spectra of a silicon wafer were also gained. The XPS spectra of each of the structure bodies and the wafer were gained in respective cases where the incident angle of the X ray was 15°, 30°, 45°, 60°, 75° and 90°.

About each of the structure bodies of the example and the comparative example, and the silicon wafer, the height of a peak of C was measured in the XPS spectrum when the incident angle of the X ray was 90°. As the peak height of C is larger, the quantity of the organic silane molecules bonded to the silicon wafer is larger.

Figure 6:
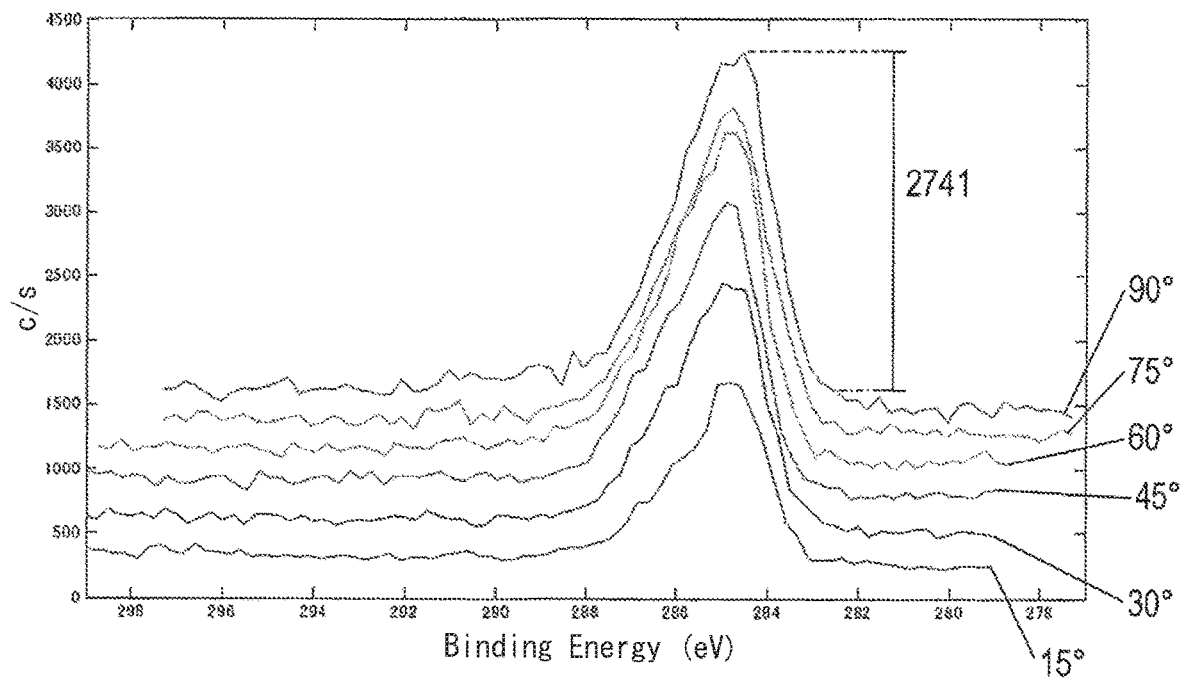
FIG. 6 is a chart showing the vicinity of a peak of C in each of XPS spectra of the structure body of the example.
Figure 7:
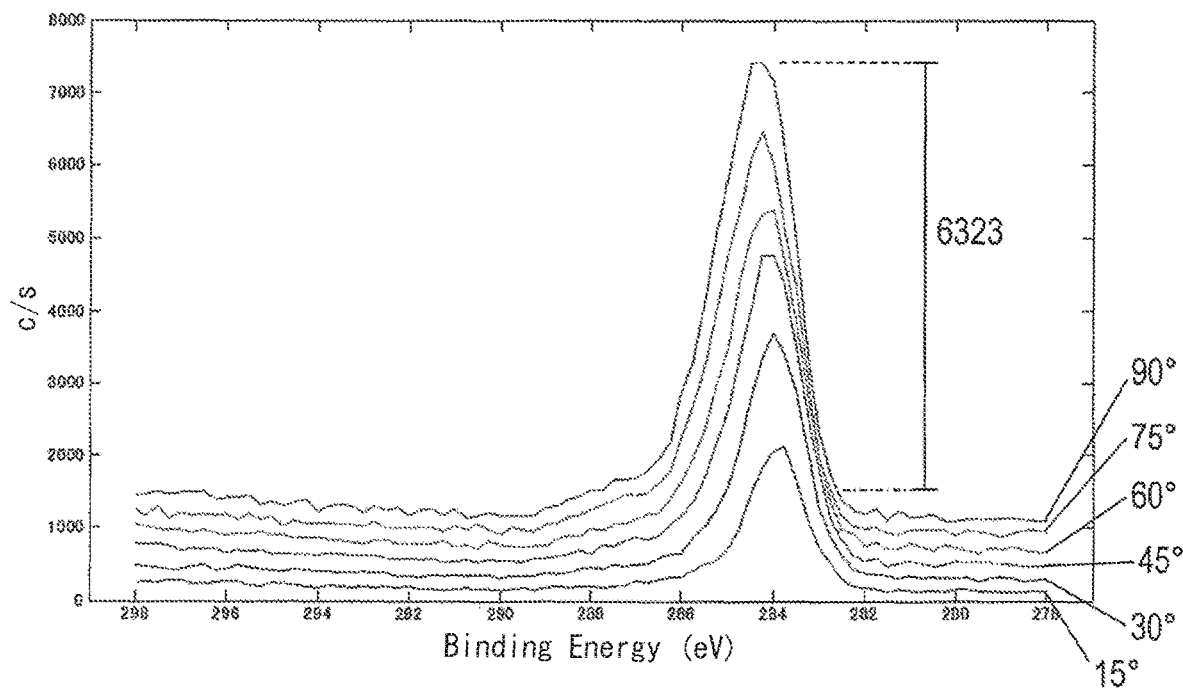
FIG. 7 is a chart showing the vicinity of a peak of C in each of XPS spectra of the structure body of the comparative example.
Figure 8:
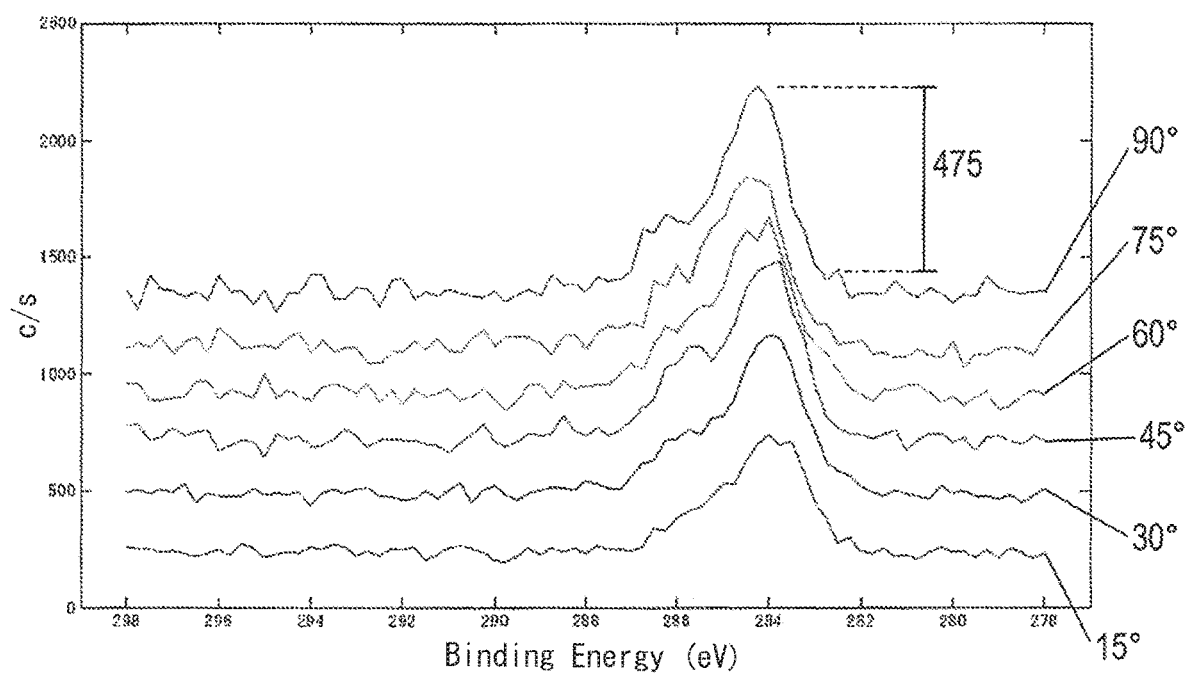
FIG. 8 is a chart showing the vicinity of a peak of C in each of XPS spectra of a silicon wafer.

The vicinity of the peak of C in each of the XPS spectra of the structure body of the example is shown in FIG. 6. In the structure body of the example, the peak height of C was 2741. The vicinity of the peak of C in each of the XPS spectra of the structure body of the comparative example is shown in FIG. 7. In the structure body of the comparative example, the peak height of C was 6323. The vicinity of the peak of C in each of the XPS spectra of the silicon wafer is shown in FIG. 8. In the silicon wafer, the peak height of C was 475.

The peak height of C in the structure body of each of the example and the comparative example was larger than that of C in the silicon wafer. This matter demonstrated that a siloxane based molecular membrane was formed in each of the structure bodies of the example and the comparative example.

The peak height of C in the structure body of the example was smaller than the peak height of C in the structure body of the comparative example. This matter demonstrated that agglomeration was less in the siloxane based molecular membrane in the structure body of the example than in the siloxane based molecular membrane in the structure body of the comparative example.

For each of the structure bodies of the example and the comparative example, and the silicon wafer, values of the $NH_2/SiN$ ratio were measured. The $NH_2/SiN$ ratio is the ratio of the peak height of N originating from $NH_2$ to that of N originating from SiN. As the $NH_2/SiN$ ratio is larger, the quantity of the organic silane molecules bonded to the silicon wafer is larger. The values of the $NH_2/SiN$ ratio were measured in respective cases where the incident angle of the X ray was 15° and 90°.

Figure 9A:
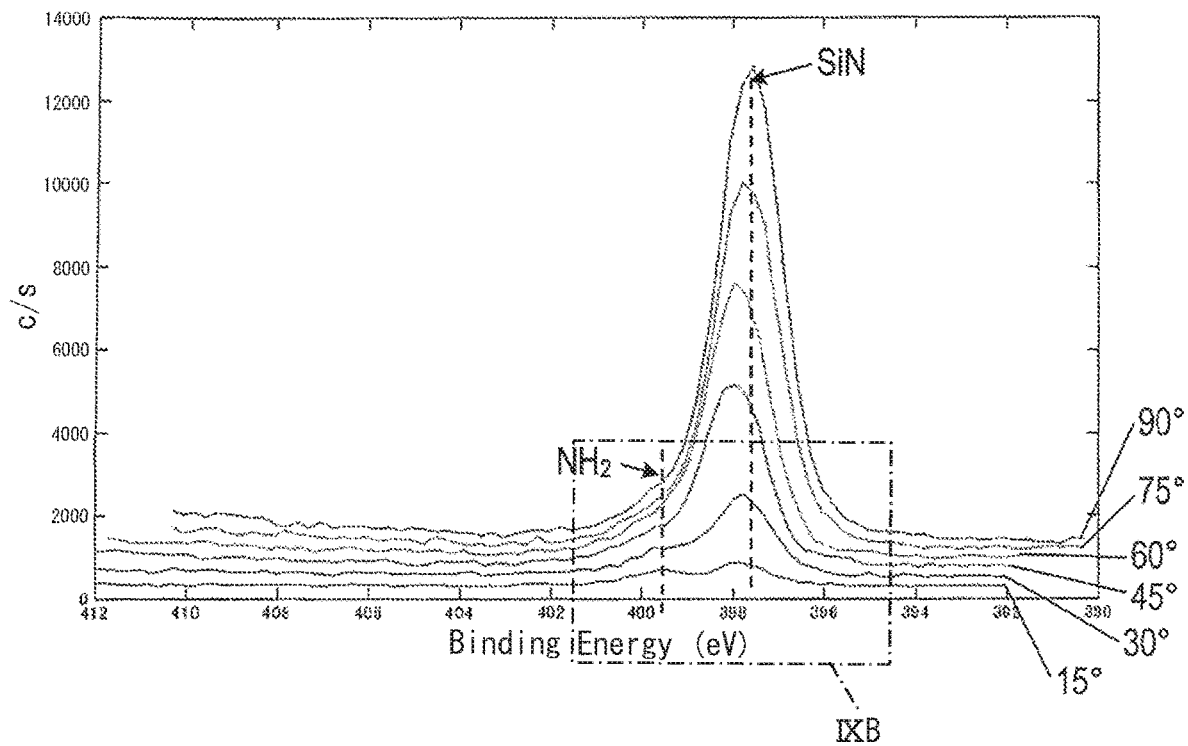
FIG. 9A is a chart showing the vicinity of a peak of N in each of the XPS spectra of the structure body of the example.
Figure 9B:
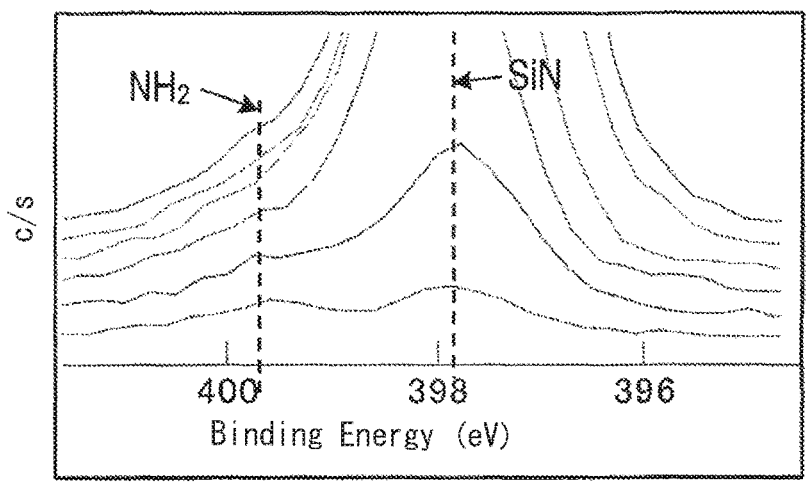
FIG. 9B is an enlarged view of a part IXB of the chart shown in FIG. 9A.

The vicinity of the peak of N in each of the XPS spectra of the structure body of the example is shown in FIG. 9A and FIG. 9B. In the structure body of the example, the $NH_2/SiN$ ratio was 0.118 when the incident angle of the X ray was 90°. The $NH_2/SiN$ ratio was 0.778 when the incident angle of the X ray was 15°.

Figure 10:
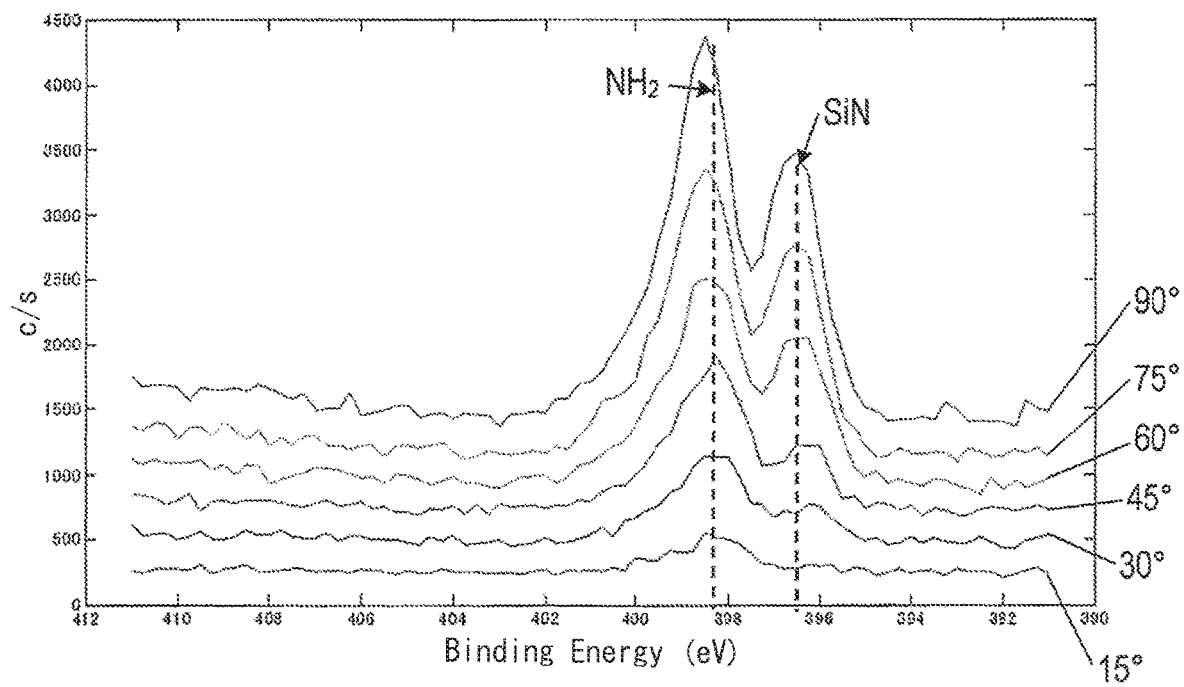
FIG. 10 is a chart showing the vicinity of a peak of N in each of the XPS spectra of the structure body of the comparative example.

The vicinity of the peak of N in each of the XPS spectra of the structure body of the comparative example is shown in FIG. 10. In the structure body of the comparative example, the $NH_2/SiN$ ratio was 1.43 when the incident angle of the X ray was 90°. The $NH_2/SiN$ ratio was 4.83 when the incident angle of the X ray was 15°.

Figure 11:
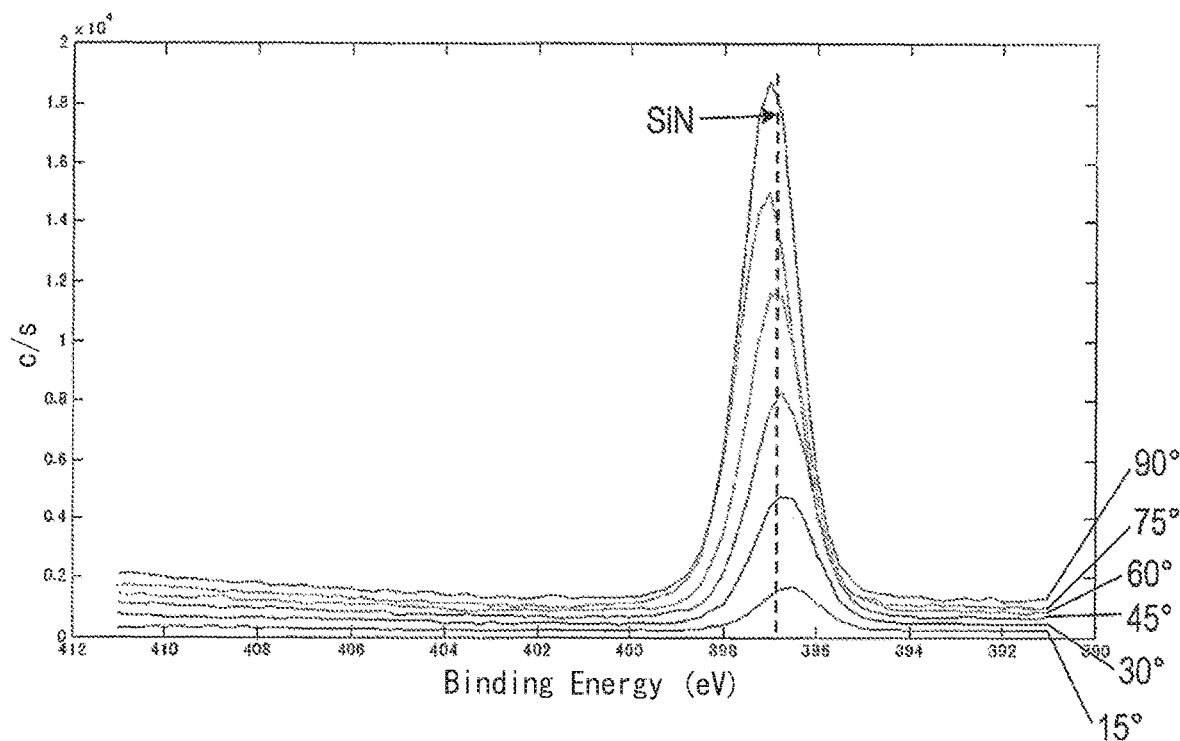
FIG. 11 is a chart showing the vicinity of a peak of N in each of the XPS spectra of the silicon wafer.

The vicinity of the peak of N, in each of the XPS spectra of the silicon wafer, is shown in FIG. 11. In the silicon wafer, the $NH_2/SiN$ ratio was 0 when the incident angle of the X ray was 90°. The $NH_2/SiN$ ratio was also 0 when the incident angle of the X ray was 15°.

The $NH_2/SiN$ ratio in the structure body of the example was smaller than that in the structure body of the comparative example. This matter demonstrated that agglomeration was less in the siloxane based molecular membrane in the structure body of the example than in the siloxane based molecular membrane in the structure body of the comparative example.

(4-4) Production of DBCO-Group-Introduced Structure Body

The following were mixed with each other: 5 μL of a DBCO-NHS solution having a concentration of 10 mM; and 495 μL of an aqueous $NHCO_3$ solution having a concentration of 0.1 M. Thus, a DBCO-NHS solution was produced which had a concentration of 100 μM (the solution will be hereinafter referred to as the 100-μM DBCO-NHS solution). The DBCO-NHS solution having a concentration of 10 mM is a commercially available product described below.

Selling agency: Sigma-Aldrich,
Product code: 761524, and
CAS No.: 1353016-71-3.

Next, the structure body of the example and the 100-μM DBCO-NHS solution produced as described above were put into an airtightly closable screw bottle. In the screw bottle, the structure body of the example was immersed in the 100-μM DBCO-NHS solution. The screw bottle was airtightly closed, and allowed to stand still at room temperature for one hour. The airtight closing of the screw bottle made it possible to restrain the solvent from being volatilized. At the time of allowing the bottle to stand still at room temperature for the one hour, $NH_2$ groups of the APTMS reacted with NHS groups of DBCO-NHS so that DBCO-NHS was bonded to the siloxane based molecular membrane. DBCO groups were introduced to the surface of the silicon wafer to interpose APTMS therebetween. The structure body of the example, in which DBCO-NHS was bonded to the siloxane based molecular membrane, will be hereinafter referred to as the DBCO-group-introduced structure body. The DBCO-group-introduced structure body corresponds to a structure body having a functional molecule.

The DBCO-group-introduced structure body was taken out from the 100-μM DBCO-NHS solution, and the structure body was dissolved into and washed with an aqueous $NaHCO_3$ solution having a concentration of 0.1 M. The dissolving and washing caused the removal of DBCO-NHS molecules remaining without being bonded to the $NH_2$ groups of APTMS.

Next, the DBCO-group-introduced structure body was washed with a deionized water to remove $NaHCO_3$. Next, the present system was subjected to nitrogen blowing to remove the deionized water. In this way, the DBCO-group-introduced structure body was dried.

(4-5) Production of Cyanine-3-Introduced Structure Body

The following were mixed with each other: 4 μL of a cyanine 3 azide solution having a concentration of 100 mM; and 396 μL of a PBS. Thus, a cyanine 3 azide solution was produced which had a concentration of 1 μM (the solution will be hereinafter referred to as the 1-μM cyanine 3 azide solution). The PBS was a buffer solution containing 137 mM of NaCl, 2.7 mM of KCl. and 10 mM of phosphoric acid. The pH of the PBS was 7.4. The cyanine 3 azide solution having a concentration of 100 mM is a commercially available product described below.

Selling agency: Lumiprobe,
Product code: B1030, and
CAS No.: None.

Next, the DBCO-group-introduced structure body and the 1-μM cyanine 3 azide solution produced as described above were put into an airtightly closable screw bottle. In the screw bottle, the DBCO-group-introduced structure body was immersed in the 1-μM cyanine 3 azide solution. The screw bottle was airtightly closed, and allowed to stand still at room temperature for one hour. The airtight closing of the screw bottle made it possible to restrain the solvent from being volatilized. At the time of allowing the bottle to stand still at room temperature for the one hour, the DBCO groups reacted with the azide groups so that cyanine 3 azide was bonded to DBCO-NHS. Thus, cyanine 3 was introduced to the surface of the silicon wafer to interpose APTMS and DBCO-NHS therebetween. The structure body into which cyanine 3 was introduced will be hereinafter referred to as the cyanine-3-introduced structure body. The cyanine-3-introduced structure body corresponds to a structure body having a functional molecule.

The cyanine-3-introduced structure body was taken out from the 1-μM cyanine 3 azide solution, and the structure body was washed with methanol and acetone. The washing caused the removal of cyanine 3 azide molecules remaining without being bonded to the DBCO groups.

Next, the cyanine-3-introduced structure body was washed with a deionized water to remove methanol and acetone. Next, the present system was subjected to nitrogen blowing to remove the deionized water. In this way, the cyanine-3-introduced structure body was dried.

(4-6) Evaluation of Structure Bodies Each Having Functional Molecule

Figure 12:
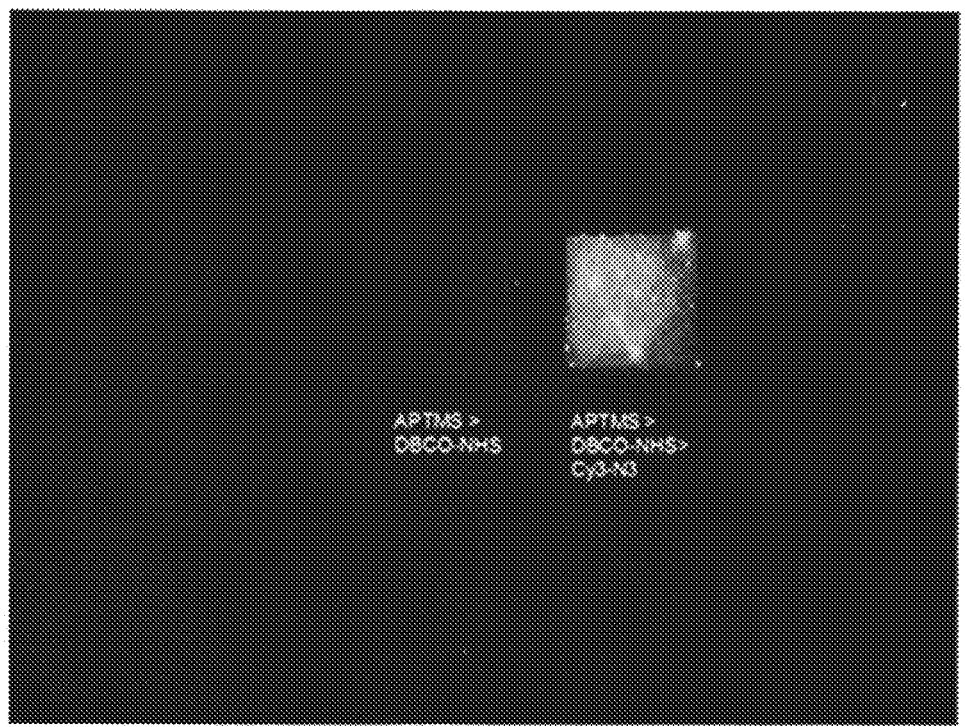
FIG. 12 is a view showing a fluorescence image of each of a DBCO-group-introduced structure body and a cyanine-3-introduced structure body.

Respective fluorescence images of the DBCO-group-introduced structure body and the cyanine-3-introduced structure body are shown in FIG. 12. In FIG. 12, "APTMS>DBCO-NHS" shows the DBCO-group-introduced structure body. In FIG. 12, "APTMS>DBCO-NHS>Cy 3-N3" shows the cyanine-3-introduced structure body.

In the surface of the DBCO-group-introduced structure body, no fluorescence was generated. In the surface of the cyanine-3-introduced structure body, fluorescence peculiar to cyanine 3 was generated. This matter made it possible to demonstrate that in the cyanine-3-introduced structure body, cyanine 3 had been introduced.

5. Other Embodiments

The above has described embodiments of the present disclosure. However, the present disclosure is not limited to the above-mentioned embodiments. Thus, the embodiments may each be carried out in the state of being variously modified.

A plurality of functions that one constituent in each of the above-mentioned embodiments has may be realized by a plurality of constituents; or one function that one constituent therein has may be realized by a plurality of constituents. A plurality of functions that a plurality of constituents therein have, respectively, may be realized by one constituent; or one function that is realized by a plurality of constituents therein may be realized by one constituent. Moreover, the configuration of each of the above-mentioned embodiments may be partially omitted. Furthermore, at least one portion or part of any one of the above-mentioned embodiments may be added to or substituted into the configuration of any one of the other embodiments. All embodiments included in the technical idea restricted by the wordings recited in the claims are embodiments of the present disclosure.

The present disclosure may be realized by the following besides the above-mentioned structure bodies: any one of products each including, as a constituent, any one of these structure bodies; methods for forming the siloxane based molecular membrane; analyzing methods each using a sensor having any one of the structure bodies; and other forms.

What is claimed is:

1. A structure body comprising:
   a base material;
   a siloxane based molecular membrane formed on the base material by use of p-aminophenyltrimethoxysilane; and
   a functional molecule bonded to the siloxane based molecular membrane,
   wherein the functional molecule includes a plurality of functional molecule species, and the functional molecule species bonded to different regions in the siloxane based molecular membrane are different from each other.

2. The structure body according to claim 1,
   wherein the functional molecule is directly or indirectly bonded to the amino group included in the p-aminophenyltrimethoxysilane.

3. The structure body according to claim 1,
   wherein the functional molecule has a function of being chemically or physically bonded to a specified molecule.

4. The structure body according to claim 1,
wherein the functional molecule is one or more selected from the group consisting of small molecules, complexes, DNAs, peptides, antibodies, and sugar chains.

5. A sensor comprising a structure body, the structure body including:
a base material;
a siloxane based molecular membrane formed on the base material by use of p-aminophenyltrimethoxysilane; and
a functional molecule bonded to the siloxane based molecular membrane, the functional molecule including a plurality of functional molecule species, and the functional molecule species bonded to different regions in the siloxane based molecular membrane are different from each other.

6. A method for producing a structure body that includes a base material and a siloxane based molecular membrane, the method comprising:

hydrophilizing a surface of the base material;

bringing an organic compound into contact with the surface of the base material, the organic compound being p-aminophenyltrimethoxysilane; and causing a hydrolysis reaction and a dehydration condensation reaction of the organic compound at a temperature of 40° C. or lower to form the siloxane based molecular membrane on the surface of the base material.

7. The method for producing a structure body according to claim 6,
wherein the bringing the organic compound into contact with the surface of the base material includes bringing a saturated solution of the organic compound into contact with the surface of the base material.

* * * * *